United States Patent
Kim et al.

(10) Patent No.: US 7,928,017 B2
(45) Date of Patent: Apr. 19, 2011

(54) METHOD OF FORMING NANOWIRE AND METHOD OF MANUFACTURING SEMICONDUCTOR DEVICE COMPRISING THE NANOWIRE

(75) Inventors: Jun-youn Kim, Suwon-si (KR); Joong S. Jeong, Seongnam-si (KR); Eun-ju Bae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 12/076,314

(22) Filed: Mar. 17, 2008

(65) Prior Publication Data

US 2009/0081854 A1 Mar. 26, 2009

(30) Foreign Application Priority Data

Sep. 21, 2007 (KR) .................. 10-2007-0096962

(51) Int. Cl.
*H01L 21/31* (2006.01)

(52) U.S. Cl. ........ 438/762; 438/197; 438/694; 438/933; 257/401; 257/E21.404; 257/E29.245; 977/747; 977/762; 977/938

(58) Field of Classification Search ............... 438/762, 438/775–777, 962, 149, 694, 933, 197, 589, 438/696, 745, 758; 257/E21.404, 401, E29.245, 257/E29.002–E29.004, E29.071, E29.069, 257/E49.001, E51.04; 977/747, 762, 938
See application file for complete search history.

(56) References Cited

U.S. PATENT DOCUMENTS

| | | | |
|---|---|---|---|
| 2008/0042120 A1* | 2/2008 | Shibata et al. | 257/13 |
| 2008/0050918 A1* | 2/2008 | Damlencourt | 438/694 |
| 2008/0116490 A1* | 5/2008 | Stewart et al. | 257/210 |
| 2008/0135949 A1* | 6/2008 | Lo et al. | 257/401 |

* cited by examiner

*Primary Examiner* — Khiem D Nguyen
*Assistant Examiner* — Su C Kim
(74) *Attorney, Agent, or Firm* — Harness, Dickey & Pierce, PLC

(57) ABSTRACT

A method of forming a nanowire and a semiconductor device comprising the nanowire are provided. The method of forming a nanowire includes forming a patterned $Si_yGe_{1-y}$ layer (where, y is a real number that satisfies $0 \leq y < 1$) on a base layer, and forming a first oxide layer and at least one nanowire within the first oxide layer by performing a first oxidation process on the patterned $Si_yGe_{1-y}$ layer.

19 Claims, 8 Drawing Sheets

METHOD OF FORMING NANOWIRE AND METHOD OF MANUFACTURING SEMICONDUCTOR DEVICE COMPRISING THE NANOWIRE

CROSS-REFERENCE TO RELATED PATENT APPLICATION

This application claims the benefit of Korean Patent Application No. 10-2007-0096962, filed on Sep. 21, 2007, in the Korean Intellectual Property Office, the disclosure of which is incorporated herein in its entirety by reference.

BACKGROUND OF THE INVENTION

1. Field of the Invention

The present invention relates to a method of manufacturing a semiconductor device, and more particularly, to a method of forming a nanowire and a method of manufacturing a semiconductor device comprising the nanowire.

2. Description of the Related Art

Recently, studies have been conducted to apply a nanowire to semiconductor devices in various fields by using the structural characteristics and quantum mechanical effects of the nanowire. Nanowires can exhibit quantum effects that cannot be exhibited by a bulk body and have a large surface area with respect to volume. The nanowires can be used as channel layers of transistors, light emitting layers of luminous devices, or sensing layers of sensing devices.

If a nanowire is used for a channel layer of a transistor, the electrical control ability of a gate with respect to the channel layer can be increased and the charge mobility in the channel layer can be increased. Thus, the line-width of the transistor can be greatly reduced and switching characteristics of the transistor can be increased.

However, due to problems related to methods of forming the nanowire, it is not easy to apply the nanowire to a semiconductor device.

More specifically, in a conventional method of forming a nanowire, for example, in a chemical vapor deposition (CVD) process involving a catalyst growing process, a large number of nanowires are formed in a single process, and it is difficult to control the position, the size, and the characteristics of nanowires to be formed. That is, it is difficult to ensure uniformity and reproducibility of the nanowire.

Conventionally, in order to manufacture a device using a nanowire, the nanowire formed on a first substrate must be moved to a second substrate. In this case, it is also difficult to accurately align the nanowire on a predetermined position of the second substrate.

SUMMARY OF THE INVENTION

To address the above and/or other problems, the present invention provides a method of forming a nanowire that has high uniformity and high reproducibility and can be readily applied to a semiconductor device.

The present invention also provides a method of manufacturing a semiconductor device comprising the nanowire.

According to an aspect of the present invention, there is provided a method of forming a nanowire including forming a patterned $Si_yGe_{1-y}$ layer (where, y is a real number that satisfies $0 \leq y < 1$) on a base layer; and forming a first oxide layer and at least one nanowire within the first oxide layer by performing a first oxidation process on the patterned $Si_yGe_{1-y}$ layer.

The forming of the patterned $Si_yGe_{1-y}$ layer may include preparing a stacked structure in which an insulating layer, a Si layer, and a $Si_xGe_{1-x}$ layer (where x is a real number that satisfies $0<x<1$) are sequentially stacked; performing a second oxidation process on the $Si_xGe_{1-x}$ layer to transform the Si layer into a $Si_yGe_{1-y}$ layer; and patterning the $Si_yGe_{1-y}$ layer.

The method may further include removing a second oxide layer formed on the $Si_yGe_{1-y}$ layer due to the second oxidation process prior to performing the first oxidation process.

A second oxide layer formed on the $Si_yGe_{1-y}$ layer due to the second oxidation process may be patterned together with the $Si_yGe_{1-y}$ layer, and may be present on the patterned $Si_yGe_{1-y}$ layer when the first oxidation process is performed.

After performing of the first oxidation process, the method may further include removing the first oxide layer and/or the second oxide layer.

The nanowire may be a $Si_zGe_{1-z}$ nanowire (where, z is a real number that satisfies $0 \leq z < 1$ and $z < y$).

The nanowires may be formed to multiple numbers, and may be separated from each other in a direction perpendicular to the base layer.

The two nanowires may be formed, and the method may further include removing one of the two nanowires positioned on an upper side of the other nanowire and the first oxide layer surrounding the nanowire positioned on the upper side of the other nanowire.

The patterned $Si_yGe_{1-y}$ layer may include a first portion having a line shape; and second and third portions that respectively contact an end and the other end of the first portion, wherein the second and third portions have a width greater than that of the first portion, and the nanowire is formed within the first portion.

A plurality of first portions may be formed between the second and third portions.

According to an aspect of the present invention, there is provided a method of manufacturing a transistor that includes a nanowire as a channel layer, wherein the nanowire is formed using the method described above.

According to an aspect of the present invention, there is provided a method of manufacturing a light emitting device that includes a nanowire as a light emitting layer, wherein the nanowire is formed using the method described above.

According to an aspect of the present invention, there is provided a method of manufacturing a detection device that includes a nanowire as a detection layer, wherein the nanowire is formed using the method described above.

According to another aspect of the present invention, there is provided a method of manufacturing a semiconductor device including forming a patterned $Si_yGe_{1-y}$ layer (where, y is a real number that satisfies $0 \leq y < 1$) on a base layer; forming a first oxide layer and at least one nanowire within the first oxide layer by performing a first oxidation process on the patterned $Si_yGe_{1-y}$ layer; removing the first oxide layer; and forming first and second conductive regions that respectively contact an end and the other end of the nanowire.

The patterned $Si_yGe_{1-y}$ layer may include a first portion having a line shape; and second and third portions that respectively contact opposite ends of the first portion, wherein the second and third portions have a width greater than that of the first portion, the nanowire is formed within the first portion, and the first and second conductive regions are respectively formed in the second and third portions of the patterned $Si_yGe_{1-y}$ layer.

The method may further include forming a gate insulating layer that surrounds the nanowire; and forming a gate electrode covering at least a portion of the gate insulating layer on the base layer, wherein one of the first and second conductive regions is a source and the other one is a drain.

One of the first and second conductive regions may be a p-type semiconductor region, and the other one may be an n-type semiconductor region.

The method may further include coating a molecular layer that functions as a receptor on a surface of the nanowire.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

A method of forming a nanowire and a method of manufacturing a semiconductor device comprising the nanowire, according to the present invention, will now be described more fully with reference to the accompanying drawings in which embodiments of the invention are shown. In the drawings, the thicknesses of layers and regions are exaggerated for clarity, and like reference numerals refer to the like elements.

FIGS. 1A through 1F are cross-sectional views for explaining a method of forming a nanowire, according to an embodiment of the present invention.

Figure 1A:
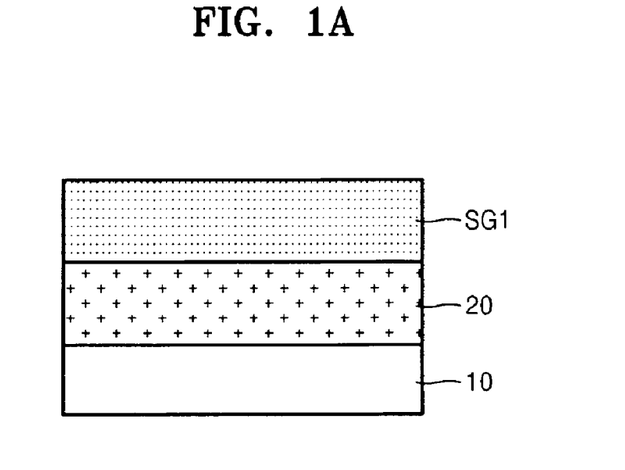
FIGS. 1A through 1F are cross-sectional views for explaining a method of forming a nanowire, according to an embodiment of the present invention.

Referring to FIG. 1A, a substrate comprising an insulating layer 10 and a Si layer 20 on the insulating layer 10, is prepared. The substrate can be a silicon on insulator (SOI) substrate. A $Si_xGe_{1-x}$ layer SG1 is formed on the Si layer 20, where x is a real number that satisfies 0<x<1. The $Si_xGe_{1-x}$ layer SG1 can be grown using an epitaxial growth method, however the present embodiment of the present invention is not limited to such method, and thus, the $Si_xGe_{1-x}$ layer SG1 can be formed using a conventional film deposition process that can be used in a semiconductor manufacturing process, for example, a sputtering process.

Figure 1B:
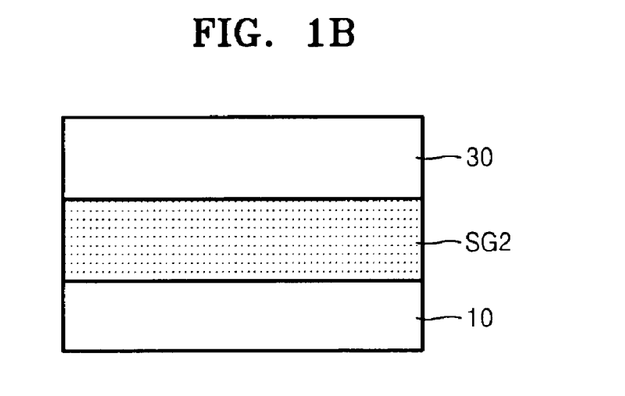

An oxidation process is performed on the $Si_xGe_{1-x}$ layer SG1. Due to the oxidation process, Si of the $Si_xGe_{1-x}$ layer SG1 combines with O, and thus, a $SiO_2$ layer 30 is formed, and Ge of the $Si_xGe_{1-x}$ layer SG1 penetrates into the Si layer 20 that is then condensed to form a $Si_yGe_{1-y}$ layer SG2, where y can be a real number that satisfies 0≦y<1. The result of the oxidation process is shown in FIG. 1B.

Figure 1C:
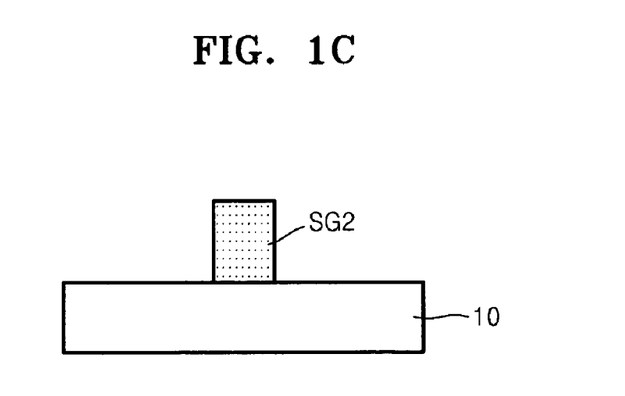

The $SiO_2$ layer 30 is removed, and then, the $Si_yGe_{1-y}$ layer SG2 is patterned to obtain the structure as shown in FIG. 1C.

Figure 2:
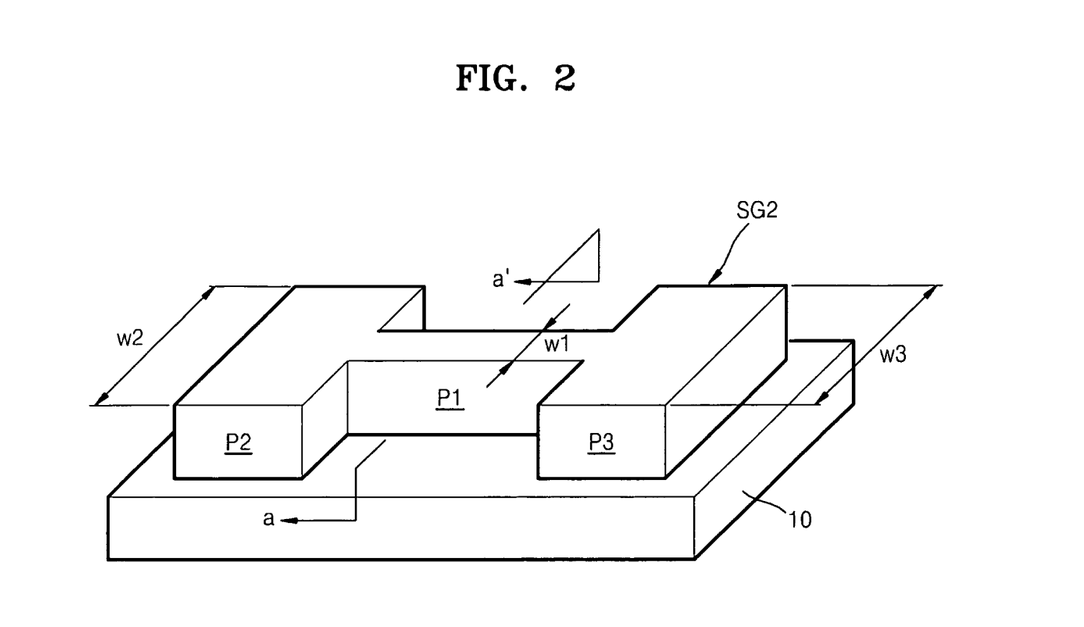
FIGS. 2 and 3 are perspective views respectively corresponding to cross-sectional views FIG. 1C and FIG. 1F, according to an embodiment of the present invention.

FIG. 1C may be a cross-sectional view taken along line a-a' of FIG. 2. Referring to FIG. 2, the patterned $Si_yGe_{1-y}$ layer SG2 can have an H shape (i.e., a dumbbell shape). That is, the patterned $Si_yGe_{1-y}$ layer SG2 can include a first portion P1 having a line shape and second and third portions P2 and P3 that respectively contact an end and the other end of the first portion P1. The second and third portions P2 and P3 may have widths w2 and w3 greater than the width w1 of the first portion P1, which is a few tens of nm. The shape of the patterned $Si_yGe_{1-y}$ layer SG2 is not limited thereto, and can have various other shapes.

Then, another oxidation process is performed on the $Si_yGe_{1-y}$ layer SG2. The other oxidation process can be a dry oxidation that can be performed at a temperature of 800 to 1100° C. under an oxygen and nitrogen gas atmosphere. Due to the other oxidation process, oxidation of the $Si_yGe_{1-y}$ layer SG2 occurs from an outer region to an inner region of the $Si_yGe_{1-y}$ layer SG2. More specifically, due to the other oxidation process, Si present in the outer region of the $Si_yGe_{1-y}$ layer SG2 firstly combines with oxygen, and thus, another $SiO_2$ layer 40 is formed, and Ge present in the outer region of the $Si_yGe_{1-y}$ layer SG2 is condensed in the inner region of the $Si_yGe_{1-y}$ layer SG2. The result of the other oxidation process is depicted in FIG. 1D.

Figure 1D:
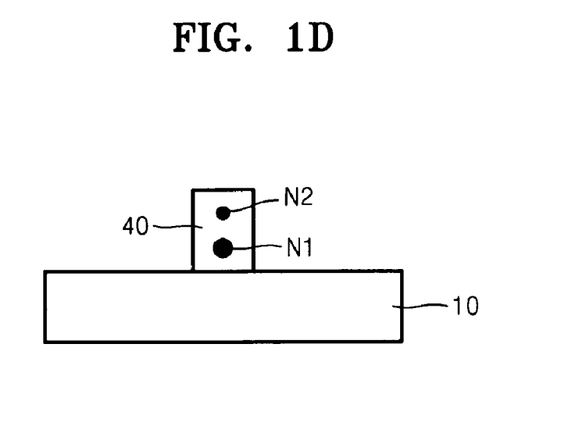

Referring to FIG. 1D, a plurality of nanowires, for example, first and second nanowires N1 and N2, vertically separated from each other, are present in the other $SiO_2$ layer 40 which is formed as a result of the other oxidation process. The first and second nanowires N1 and N2 can be formed in the first portion P1 described with reference to FIG. 2. Since the second and third portions P2 and P3 described with reference to FIG. 2 have a width greater than that of the first portion P1, SiGe bulk bodies can remain in the second and third portions P2 and P3 after the other oxidation process is completed.

In FIG. 1D, the second nanowire N2 can have a diameter smaller than that of the first nanowire N1 that is on the lower side of the second nanowire N2. This is because the penetration of oxygen from the lower side of the first nanowire N1 is repressed by the insulating layer 10. The diameters of the first and second nanowires N1 and N2 can be controlled according to oxidation conditions of the other oxidation process. In addition, during when the other oxidation process is performed, stress is exerted at interfaces between the first and second nanowires N1 and N2 and the other $SiO_2$ layer 40. Due to the stress, the speed of penetration of oxygen into the first and second nanowires N1 and N2 can be gradually decreased. When the stress reaches or is greater than a critical value, oxygen cannot further penetrate into the first and second nanowires N1 and N2. In this case, even if the other oxidation process is performed for a long period of time, the first and second nanowires N1 and N2 do not disappear due to oxidation however can remain with a predetermined diameter. For example, the first and second nanowires N1 and N2 can have a diameter of a few to a few tens of nm.

Since the first and second nanowires N1 and N2 are formed by the condensation of Ge, the content of Ge in the first and second nanowires N1 and N2 can be greater than the Ge content in the $Si_yGe_{1-y}$ layer SG2. That is, the first and second nanowires N1 and N2 are $Si_zGe_{1-z}$ nanowires, where, z is a real number that satisfies 0≦z<1 and z<y. For example, the first and second nanowires N1 and N2 can be a Ge nanowires.

Figure 1E:
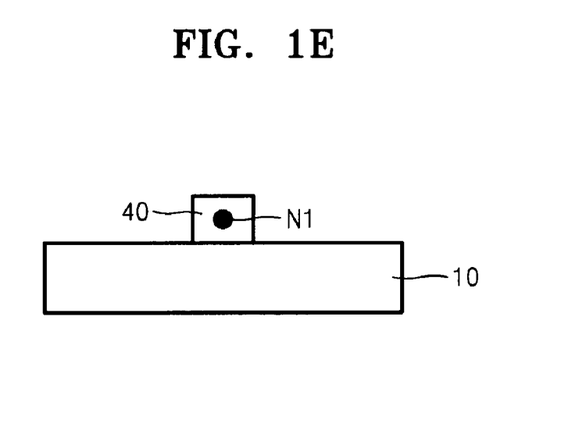

A structure depicted in FIG. 1E can be obtained by removing the second nanowire N2 and the other $SiO_2$ layer 40 that surrounds the second nanowire N2. At this point, a portion or all of the other $SiO_2$ layer 40 formed on surfaces of the second and third portions P2 and P3 described with reference to FIG. 2 can be removed, and a portion of thickness of the SiGe bulk bodies present in the inner side of the second and third portions P2 and P3 can be removed.

Figure 1F:
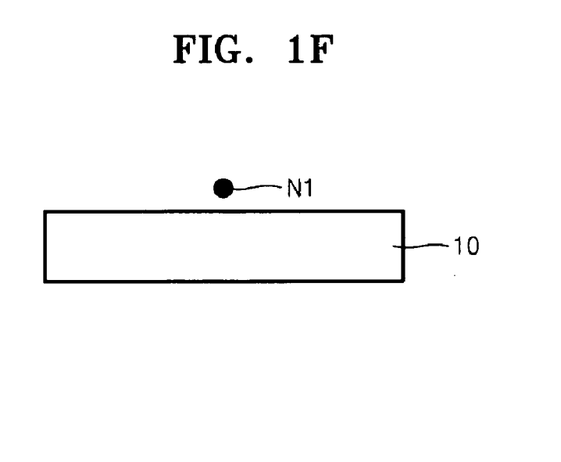
Figure 3:
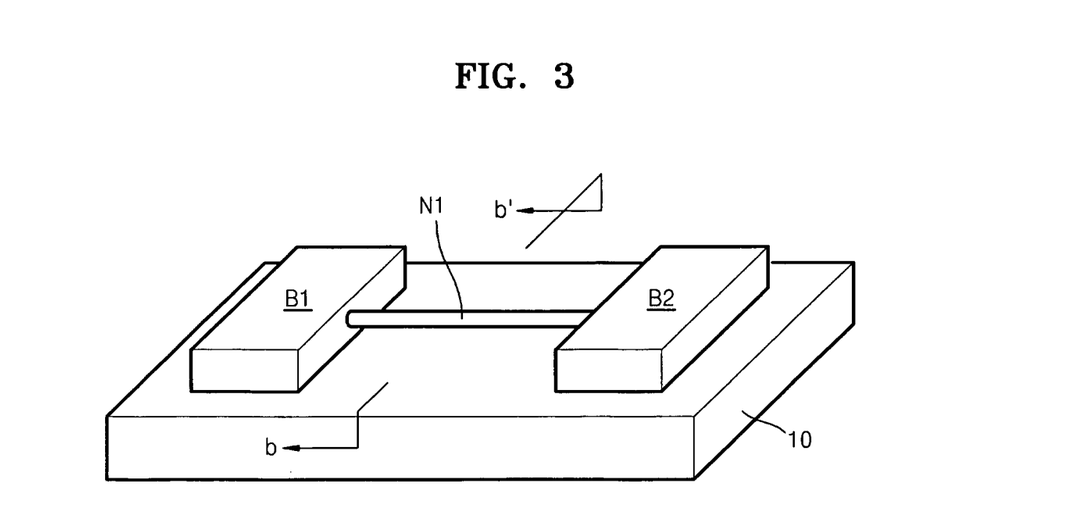

Next, the remaining other $SiO_2$ layer 40 in FIG. 1E is removed. The result of the removing the remaining other $SiO_2$ layer 40 is depicted in FIG. 1F. FIG. 1F may be a cross-sectional view taken along line b-b' of FIG. 3 that is a perspective view. Referring to FIG. 3, the first nanowire N1 is formed between first and second SiGe bulk bodies B1 and B2 which are the remaining portions of the second and third portions P2 and P3.

Figure 4A:
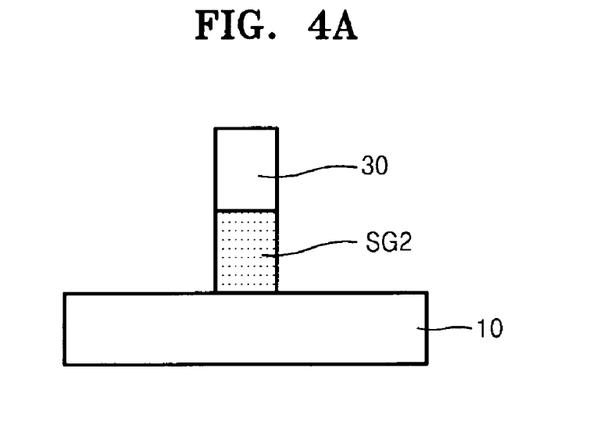
FIGS. 4A through 4C are cross-sectional views for explaining a method of forming a nanowire, according to another embodiment of the present invention.
Figure 4B:
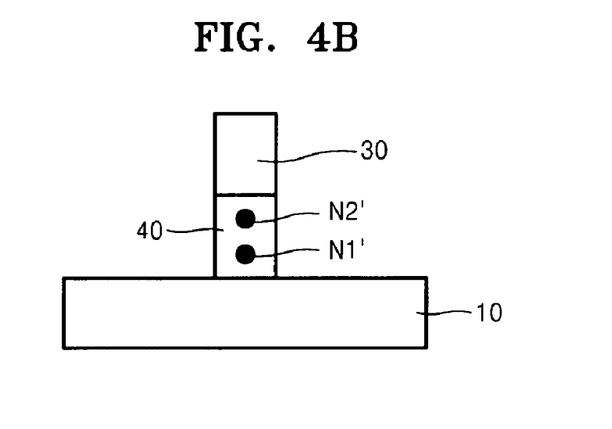
Figure 4C:
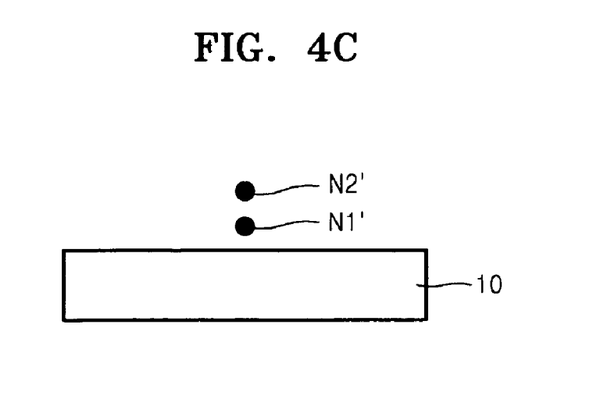

FIGS. 4A through 4C are cross-sectional views for explaining a method of forming a nanowire, according to another embodiment of the present invention. The present embodiment is a modified version of the foregoing embodiment described with reference to FIGS. 1A through 1F.

The structure, as shown in FIG. 4A, is obtained by patterning the $SiO_2$ layer 30 and the $Si_yGe_{1-y}$ layer SG2, instead of removing the $SiO_2$ layer 30 of FIG. 1B.

If an oxidation process is performed on the $Si_yGe_{1-y}$ layer SG2, a resultant product, as depicted in FIG. 4B, can be obtained. In FIG. 4B, first and second nanowires N1' and N2' can have the same diameter and are separated from each other in a vertical direction. This is because since a bottom surface and a top surface of the $Si_yGe_{1-y}$ layer SG2 are respectively covered by the insulating layer 10 and the $SiO_2$ layer 30, the amount of oxygen ions penetrating into the first nanowire N1' from a lower side of the first nanowire N1' and the amount of oxygen ions penetrating into the second nanowire N2' from an upper side of the second nanowire N2' are similar to each other. The first and second nanowires N1' and N2' having a similar diameter have similar characteristics, and thus, can be used together in the same device.

Figure 5:
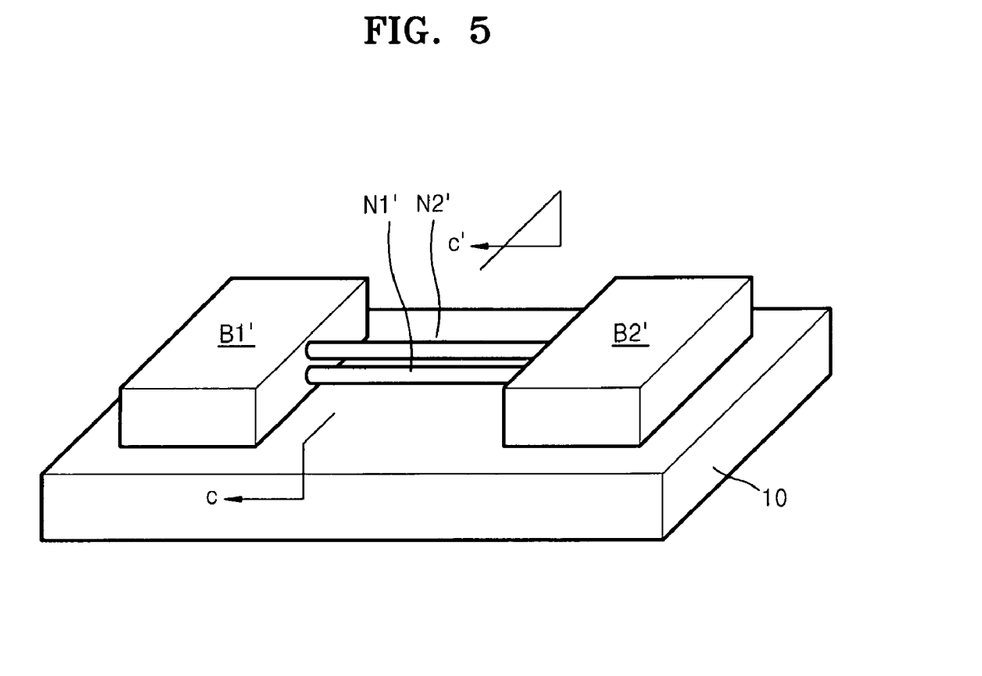
FIG. 5 is a perspective view corresponding to the cross-sectional view of FIG. 4C.

Then, the $SiO_2$ layer 30 and the other $SiO_2$ layer 40, which surrounds the first and second nanowires N1' and N2', are removed, as depicted in FIG. 4C. FIG. 4C may be a cross-sectional view taken along line c-c' of FIG. 5 that is a perspective view. Referring to FIG. 5, the first and second nanowires N1' and N2' are formed between first and second SiGe bulk bodies B1' and B2'.

In the embodiments of the present invention described with reference to FIGS. 1A through 1F and FIGS. 4A through 4C, multiple number of patterned $Si_yGe_{1-y}$ layers SG2 can be formed. Also, in the present embodiments, a plurality of first portions P1 can be formed between the second and third portions P2 and P3 of FIG. 2. Therefore, according to another embodiment of the present invention, at least one structural body in which two SiGe bulk bodies that are separated from each other and a plurality of nanowires arranged in a single layer structure or a multiple layer structure between the two SiGe bulk bodies can be formed.

Figure 6:
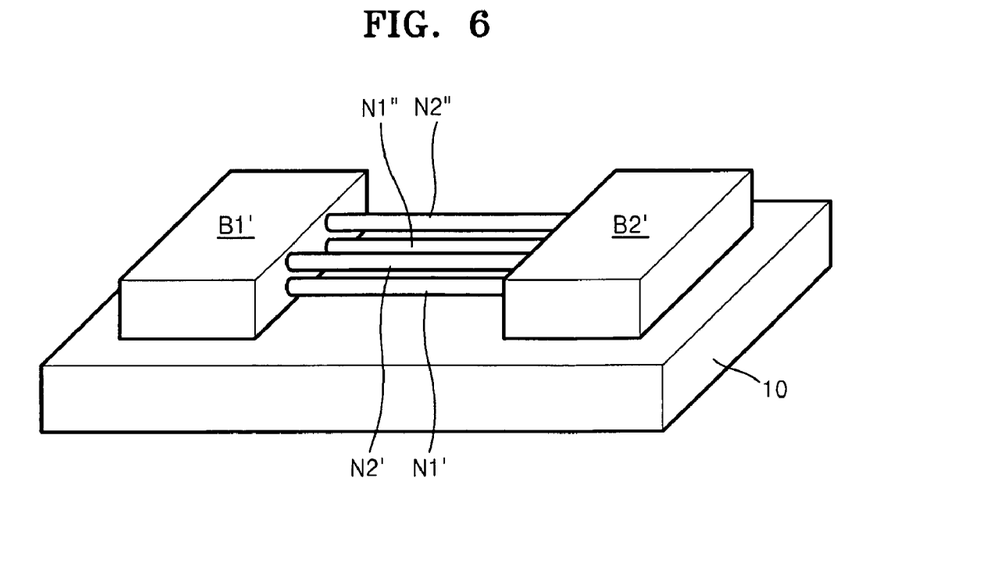
FIG. 6 is a perspective view of a structure formed using the method of forming a nanowire, according to another embodiment of the present invention.

FIG. 6 is a perspective view of a structure formed using the method of forming a nanowire, according to another embodiment of the present invention. In FIG. 6, reference numerals N1', N1", N2' and N2" denote nanowires. A nanowire formed using the method according to the present invention can be used in various fields. Hereinafter, a method of manufacturing a semiconductor device according to an embodiment of the present invention will now be described.

Figure 7A:
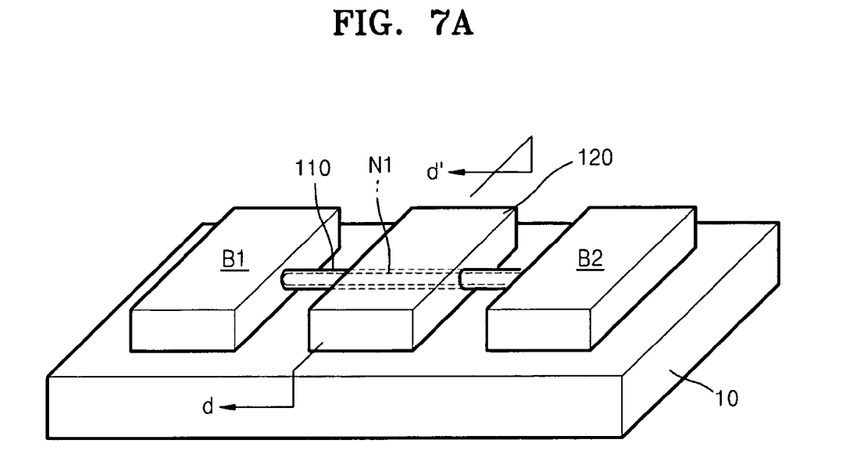
FIGS. 7A and 7B are perspective views for explaining a method of manufacturing a semiconductor device, according to an embodiment of the present invention.
Figure 7B:
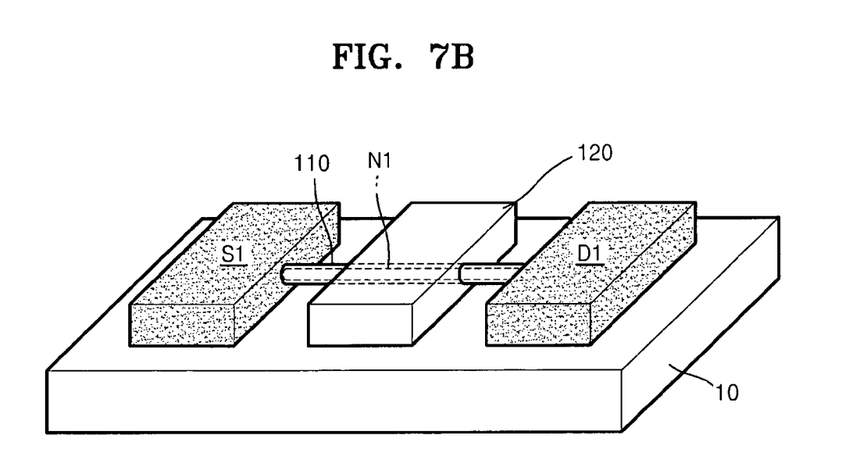

FIGS. 7A and 7B are perspective views for explaining the method of manufacturing a semiconductor device according to an embodiment of the present invention. In the present embodiment, a transistor is manufactured on the structural body of FIG. 3 will be described.

Figure 8:
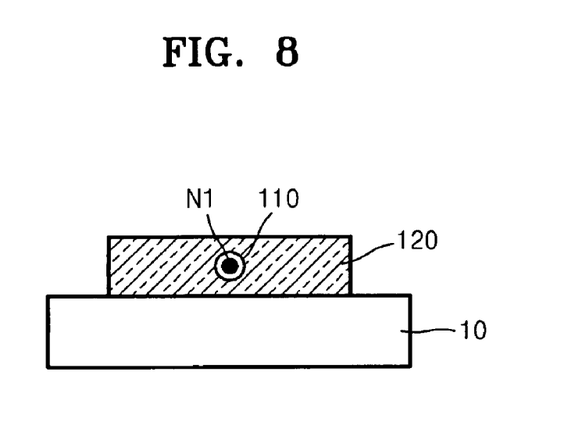
FIG. 8 is a cross-sectional view taken along line d-d' of FIG. 7A.

Referring to FIG. 7A, a gate insulating layer 110 that surrounds a first nanowire N1 is formed, and then, a gate electrode 120 covering the gate insulating layer 110 is formed on an insulating layer 10 between first and second SiGe bulk bodies B1 and B2. The gate insulating layer 110 can be formed using a thermal oxidation process, a CVD process, or an atomic layer deposition (ALD) process, and can be a $SiO_2$ layer, a $Si_3N_4$, or a high dielectric material layer such as $HfO_2$ or $ZrO_2$. The gate electrode 120 does not contact the first and second SiGe bulk bodies B1 and B2 and may surround the gate insulating layer 110. FIG. 8 is a cross-sectional view taken along line d-d' of FIG. 7A.

Then, referring to FIG. 7B, a source S1 and a drain D1 are formed by injecting a conductive dopant into the first and second SiGe bulk bodies B1 and B2.

Thus, the method of manufacturing a transistor using the structural body of FIG. 3 has been described. However, the present is not limited thereto, and thus, transistors can also be manufactured using the structural bodies of FIG. 5 and FIG. 6.

A nanowire formed using the method according to the present invention can be used as a channel layer of a transistor, and can also be used as a light emitting layer of a light emitting device, a sensing layer of a detection device, or as applicable.

Figure 9A:
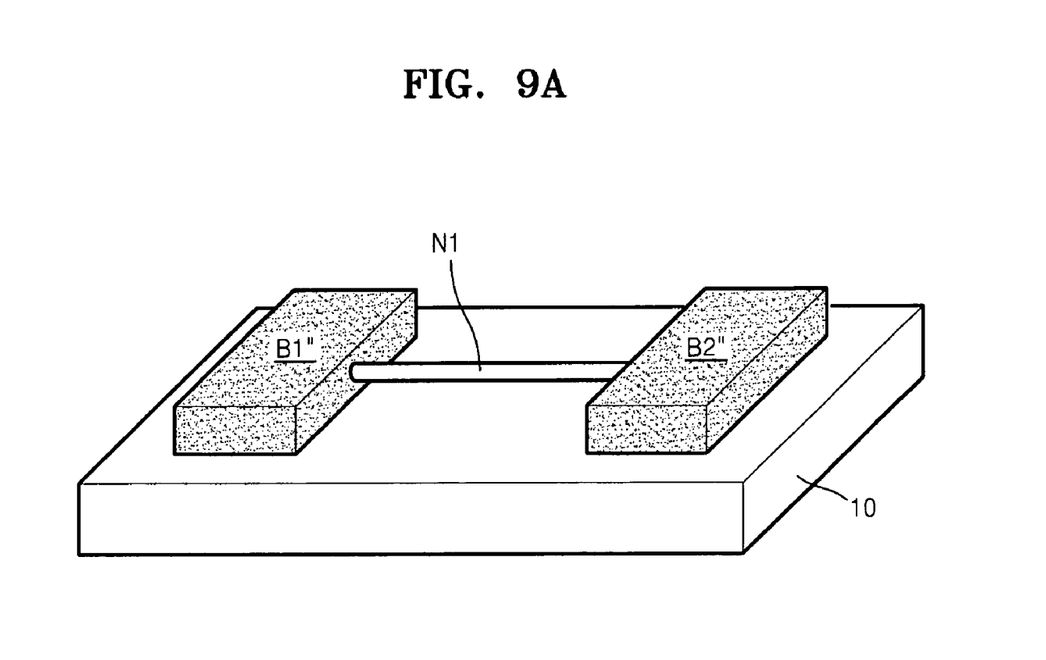
FIGS. 9A and 9B are perspective views for explaining a method of manufacturing a semiconductor device, according to another embodiment of the present invention.
Figure 9B:
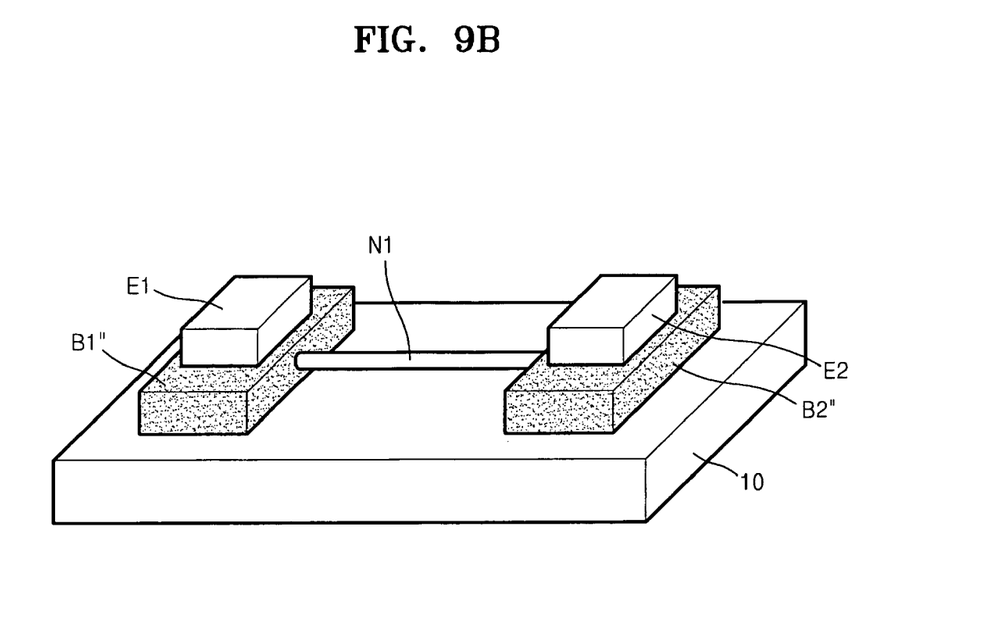

FIGS. 9A and 9B are perspective views for explaining a method of manufacturing a semiconductor device, according to another embodiment of the present invention. In the present embodiment, a method of manufacturing a light emitting device in the structural body of FIG. 3 will be described.

Referring to FIG. 9A, a first conductive semiconductor layer B1" and a second conductive semiconductor layer B2" are formed on the insulating layer 10 by respectively doping a first conductive dopant, for example, a p-type dopant, into the first SiGe bulk body B1 (refer to FIG. 3), and a second conductive dopant, for example, an n-type dopant, into the second bulk body B2 (refer to FIG. 3).

Referring to FIG. 9B, a first electrode E1 and a second electrode E2 are respectively formed on the first conductive semiconductor layer B1" and the second conductive semiconductor layer B2". Although not shown, a transparent insulating layer, having a height to at least bury the first nanowire N1, can be formed on the insulating layer 10. Also, a reflection layer can further be included between the insulating layer 10, which is formed between the first conductive semiconductor layer B1" and the second conductive semiconductor layer B2", and the transparent insulating layer.

Also, although not shown, if a molecular layer, which functions as a receptor, is coated on a surface of a nanowire according to the embodiments of the present invention, and source and drain, which contact the nanowire on which the molecular layer is coated, is formed, a detection device can be manufactured. Here, the source and drain can be equivalent to the source S1 and drain D1 of FIG. 7B.

In the methods of manufacturing a semiconductor device according to the present embodiments, a nanowire is formed using patterning and oxidation processes, and thus, the size of the nanowire and the position where the nanowire is to be formed can be readily controlled. Also, if a nanowire is formed on a substrate, a semiconductor device can be formed on the substrate where the nanowire is formed without needing to transfer the nanowire to another substrate. Accordingly, according to the embodiments of the present invention, a nanowire having high characteristic uniformity and high reproducibility, and a semiconductor device comprising the nanowire can be readily realized.

In particular, a transistor according to an embodiment of the present invention includes a $Si_zGe_{1-z}$ layer (where, z is a real number that satisfies $0 \leq z < 1$) as a channel layer. The $Si_zGe_{1-z}$ layer has a charge mobility higher than that of a Si layer. Thus, such transistor has operation characteristics higher than that of a conventional transistor.

According to the present invention, the size of a nanowire and the position where the nanowire is to be formed can be readily controlled, and also, it is unnecessary to move the nanowire to another substrate to manufacture a semiconductor device. Thus, according to the present invention, a nanowire having high characteristic uniformity and high reproducibility and a semiconductor device comprising the nanowire can be readily realized.

In particular, a transistor according to the present invention includes a $Si_zGe_{1-z}$ layer ($0 \leq z < 1$) as a channel layer, and thus, such transistor has operation characteristics higher than that of a conventional transistor.

While the present invention has been shown and described with reference to embodiments thereof, it should not be construed as being limited to such embodiments. That is, one skilled in this art knows that, for example, the nanowire can be used for manufacturing a semiconductor device by separating the nanowire from the structural bodies of FIGS. 3, 5, and 6, and the method of manufacturing a semiconductor device described with reference to FIGS. 7A, 7B, 9A, and 9B can be modified in various ways. Therefore, the scope of the invention is not defined by the detailed description of the invention however by the appended claims.

What is claimed is:

1. A method of forming a nanowire comprising:
   forming a stacked structure by sequentially stacking an insulating layer, a Si layer, and a $Si_xGe_{1-x}$ layer (where x is a real number that satisfies $0 < x < 1$);
   performing a first condensing process to condense Ge from the $Si_xGe_{1-x}$ layer into the Si layer, the first condensing process including a first oxidation process, the first oxidation process performed on the $Si_xGe_{1-x}$ layer to transform the Si layer into a $Si_yGe_{1-y}$ layer (where, y is a real number that satisfies $0 \leq y < 1$);
   forming a patterned $Si_yGe_{1-y}$ layer by patterning the $Si_yGe_{1-y}$ layer; and
   performing a second condensing process to condense Ge present in the outer region of the $Si_yGe_{1-y}$ layer into the inner region of the $Si_yGe_{1-y}$ layer, the second condensing process including a second oxidation process, the second oxidation process performed on the patterned $Si_yGe_{1-y}$ layer to form a first oxide layer and at least one nanowire within the first oxide layer.

2. The method of claim 1, further comprising:
   removing a second oxide layer formed on the $Si_yGe_{1-y}$ layer due to the first oxidation process prior to performing the second oxidation process.

3. The method of claim 1, wherein a second oxide layer formed on the $Si_yGe_{1-y}$ layer due to the first oxidation process, is patterned together with the $Si_yGe_{1-y}$ layer, and is present on the patterned $Si_yGe_{1-y}$ layer when the second oxidation process is performed.

4. The method of claim 3, further comprising:
   removing the second oxide layer after performing the second oxidation process.

5. The method of claim 4, further comprising removing the first oxide layer.

6. The method of claim 1, further comprising removing the first oxide layer.

7. The method of claim 1, wherein the nanowire is a $Si_zGe_{1-z}$ nanowire (where, z is a real number that satisfies $0 \leq z < 1$ and $z < y$).

8. The method of claim 1, wherein the nanowires are formed to multiple numbers, and are separated from each other in a direction perpendicular to a base layer.

9. The method of claim 8, wherein two nanowires are formed, and
   the method further comprises removing one of the two nanowires positioned on an upper side of the other nanowire and the first oxide layer surrounding the nanowire positioned on the upper side of the other nanowire.

10. The method of claim 1, wherein the patterned $Si_yGe_{1-y}$ layer comprises:
    a first portion having a line shape; and
    second and third portions that respectively contact an end and the other end of the first portion,
    wherein the second and third portions have a width greater than that of the first portion, and the nanowire is formed within the first portion.

11. The method of claim 10, wherein a plurality of first portions are formed between the second and third portions.

12. A method of manufacturing a semiconductor device comprising:
    forming a stacked structure by sequentially stacking an insulating layer, a Si layer, and a $Si_xGe_{1-x}$ layer (where x is a real number that satisfies $0 < x < 1$);
    performing a first condensing process to condense Ge from the $Si_xGe_{1-x}$ layer into the Si layer, the first condensing process including a first oxidation process, the first oxidation process performed on the $Si_xGe_{1-x}$ layer to transform the Si layer into a $Si_yGe_{1-y}$ layer (where, y is a real number that satisfies $0 \leq y < 1$);
    forming a patterned $Si_yGe_{1-y}$ layer by patterning the $Si_yGe_{1-y}$ layer;
    performing a second condensing process to condense Ge present in the outer region of the $Si_yGe_{1-y}$ layer into the inner region of the $Si_yGe_{1-y}$ layer, the second condensing process including a second oxidation process, the second oxidation process performed on the patterned $Si_yGe_{1-y}$ layer to form a first oxide layer and at least one nanowire within the first oxide layer;
    removing the first oxide layer; and
    forming first and second conductive regions that respectively contact an end and the other end of the nanowire.

13. The method of claim 12, wherein the patterned $Si_yGe_{1-y}$ layer comprises:
    a first portion having a line shape; and
    second and third portions that respectively contact opposite ends of the first portion,
    wherein the second and third portions have a width greater than that of the first portion, the nanowire is formed within the first portion, and the first and second conductive regions are respectively formed in the second and third portions of the patterned $Si_yGe_{1-y}$ layer.

14. The method of claim 12, further comprising:
    forming a gate insulating layer that surrounds the nanowire; and
    forming a gate electrode covering at least a portion of the gate insulating layer,
    wherein one of the first and second conductive regions is a source and the other one is a drain.

15. The method of claim 12, wherein one of the first and second conductive regions is a p-type semiconductor region, and the other one is an n-type semiconductor region.

16. The method of claim 12, further comprising coating a molecular layer that functions as a receptor on a surface of the nanowire.

17. A method of manufacturing a transistor that comprises a nanowire as a channel layer,
 wherein the nanowire is formed using the method described in claim 1.

18. A method of manufacturing a light emitting device that comprises a nanowire as a light emitting layer,
 wherein the nanowire is formed using the method described in claim 1.

19. A method of manufacturing a detection device that comprises a nanowire as a detection layer,
 wherein the nanowire is formed using the method described in claim 1.

* * * * *